(12) United States Patent
Von Malm et al.

(10) Patent No.: US 9,859,330 B2
(45) Date of Patent: Jan. 2, 2018

(54) METHOD FOR PRODUCING A LIGHT-EMITTING DIODE DISPLAY AND LIGHT-EMITTING DIODE DISPLAY

(71) Applicant: OSRAM Opto Semiconductors GmbH, Regensburg (DE)

(72) Inventors: Norwin Von Malm, Nittendorf (DE); Martin Mandl, Lappersdorf (DE); Alexander F. Pfeuffer, Regensburg (DE); Britta Goeoetz, Regensburg (DE)

(73) Assignee: OSRAM OPTO SEMICONDUCTOR GMBH, Regensburg (DE)

( * ) Notice: Subject to any disclaimer, the term of this patent is extended or adjusted under 35 U.S.C. 154(b) by 0 days.

(21) Appl. No.: 14/433,379

(22) PCT Filed: Sep. 30, 2013

(86) PCT No.: PCT/EP2013/070352
§ 371 (c)(1),
(2) Date: Apr. 2, 2015

(87) PCT Pub. No.: WO2014/053445
PCT Pub. Date: Apr. 10, 2014

(65) Prior Publication Data
US 2015/0279902 A1 Oct. 1, 2015

(30) Foreign Application Priority Data
Oct. 4, 2012 (DE) .................. 10 2012 109 460

(51) Int. Cl.
*H01L 29/18* (2006.01)
*H01L 27/15* (2006.01)
(Continued)

(52) U.S. Cl.
CPC ........ *H01L 27/156* (2013.01); *H01L 25/0753* (2013.01); *H01L 29/66568* (2013.01);
(Continued)

(58) Field of Classification Search
CPC ..... H01L 27/153; H01L 27/156; H01L 33/20; H01L 33/24; H01L 33/26; H01L 33/48; H01L 33/507
(Continued)

(56) References Cited

U.S. PATENT DOCUMENTS 4,127,792 A   11/1978  Nakata
4,774,205 A *  9/1988  Choi .................. H01L 21/8258
                                                 148/DIG. 149
(Continued)

FOREIGN PATENT DOCUMENTS

CN       101443887 A    5/2009
CN       101627481 A    1/2010
(Continued)

OTHER PUBLICATIONS

Tomioka et al., "III-V Nanowires on Si Substrate: Selective-Area Growth and Device Applications", IEEE Journal of Selected Topics in Quantum Electronics 17 (2011) pp. 1112-1129.*
(Continued)

*Primary Examiner* — Jay C Kim
(74) *Attorney, Agent, or Firm* — McDermott Will & Emery LLP

(57) ABSTRACT

In at least one embodiment, the method is designed for producing a light-emitting diode display (1). The method comprises the following steps: •A) providing a growth substrate (2); •B) applying a buffer layer (4) directly or indirectly onto a substrate surface (20); •C) producing a plurality of separate growth points (45) on or at the buffer layer (4); •D) producing individual radiation-active islands (5), originating from the growth points (45), wherein the islands (5) each comprise an inorganic semiconductor layer sequence (50) with at least one active zone (55) and have a mean diameter, when viewed from above onto the substrate
(Continued)

Figure 1:
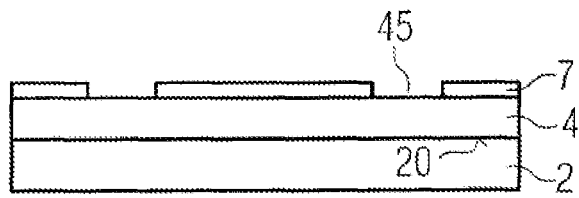
Figure 1:
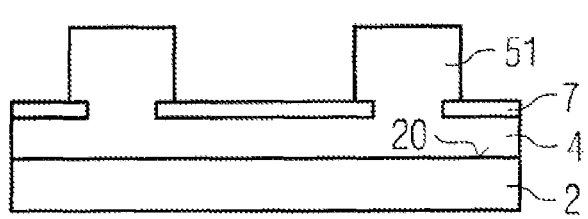
Figure 1:
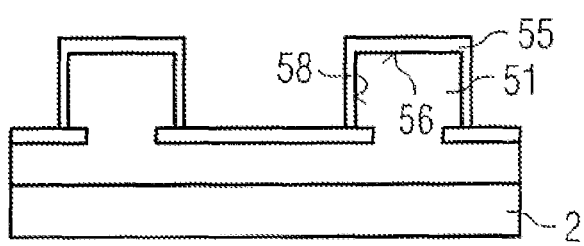
Figure 1:
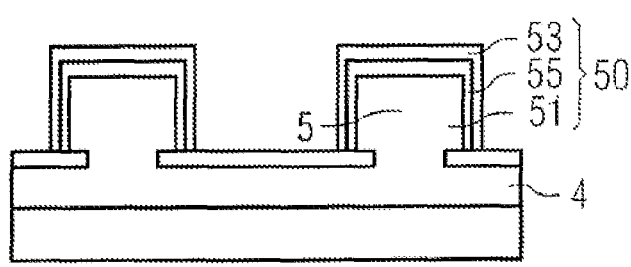
Figure 1:
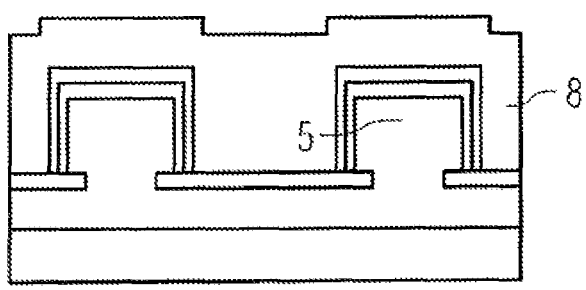

surface (20), between 50 nm and 20 μm inclusive; and •E) connecting the islands (5) to transistors (6) for electrically controlling the islands (5).

10 Claims, 8 Drawing Sheets

(51) Int. Cl.
*H01L 25/075* (2006.01)
*H01L 29/66* (2006.01)
*H01L 29/78* (2006.01)
*H01L 33/00* (2010.01)
*H01L 33/12* (2010.01)
*H01L 33/50* (2010.01)

(52) U.S. Cl.
CPC ............ *H01L 29/78* (2013.01); *H01L 33/007* (2013.01); *H01L 33/12* (2013.01); *H01L 33/507* (2013.01); *H01L 2924/0002* (2013.01); *H01L 2933/0041* (2013.01); *H01L 2933/0091* (2013.01)

(58) Field of Classification Search
USPC .......................................................... 257/88
See application file for complete search history.

(56) References Cited

U.S. PATENT DOCUMENTS

| | | | | |
|---|---|---|---|---|
| 5,789,766 A * | 8/1998 | Huang | ................. | H01L 27/156 257/83 |
| 5,893,721 A * | 4/1999 | Huang | ................. | H01L 27/3276 438/23 |
| 6,242,324 B1 * | 6/2001 | Kub | ................. | B82Y 10/00 257/E21.122 |
| 6,355,945 B1 | 3/2002 | Kadota et al. | | |
| 6,410,942 B1 * | 6/2002 | Thibeault | ................. | H01L 33/08 257/88 |
| 6,759,262 B2 * | 7/2004 | Theil | ................. | H01L 27/14609 257/444 |
| 7,589,355 B2 * | 9/2009 | Tomoda | ................. | H01L 33/20 257/100 |
| 7,884,543 B2 * | 2/2011 | Doi | ................. | H01L 33/62 257/98 |
| 8,101,457 B2 * | 1/2012 | Tomoda | ................. | G09F 9/33 257/E21.499 |
| 8,106,429 B2 * | 1/2012 | Kim | ................. | H01L 27/14636 257/252 |
| 8,232,640 B2 * | 7/2012 | Tomoda | ................. | H01L 23/49811 257/737 |
| 8,350,251 B1 * | 1/2013 | Lowgren | ................. | H01L 33/06 257/13 |
| 8,389,348 B2 * | 3/2013 | Thei | ................. | H01L 21/8258 257/183 |
| 8,552,416 B2 * | 10/2013 | Kim | ................. | H01L 51/502 257/13 |
| 8,573,784 B2 * | 11/2013 | Yeh | ................. | G03B 21/00 353/52 |
| 8,643,179 B2 * | 2/2014 | Im | ................. | H01L 23/49811 257/686 |
| 8,735,797 B2 * | 5/2014 | Yu | ................. | B82Y 15/00 250/214.1 |
| 8,791,470 B2 * | 7/2014 | Wober | ................. | H01L 27/14 257/80 |
| 8,809,126 B2 * | 8/2014 | Lowenthal | ................. | H01L 25/048 257/100 |
| 8,816,508 B2 * | 8/2014 | Liu | ................. | H01L 25/167 257/723 |
| 8,847,199 B2 * | 9/2014 | Cha | ................. | B82Y 20/00 257/13 |
| 8,895,955 B2 * | 11/2014 | Kim | ................. | B82Y 10/00 257/103 |
| 8,895,958 B2 * | 11/2014 | Fukui | ................. | H01L 21/02488 257/12 |
| 9,087,812 B2 * | 7/2015 | Briere | ................. | H01L 29/868 |
| 9,164,353 B2 * | 10/2015 | Jeon, II | ................. | G02F 2/02 |
| 9,181,630 B2 * | 11/2015 | Shibata | ................. | H01L 25/0753 |
| 9,190,590 B2 * | 11/2015 | Shibata | ................. | H01L 33/64 |
| 9,281,388 B2 * | 3/2016 | Briere | ................. | H01L 29/41766 |
| 2006/0223211 A1 * | 10/2006 | Mishra | ................. | B82Y 10/00 438/41 |
| 2008/0036038 A1 | 2/2008 | Hersee et al. | | |
| 2009/0321738 A1 * | 12/2009 | Kim | ................. | B82Y 10/00 257/59 |
| 2010/0117997 A1 | 5/2010 | Haase | | |
| 2010/0163900 A1 | 7/2010 | Seo et al. | | |
| 2010/0289037 A1 * | 11/2010 | Matsumoto | ................. | H01L 27/1266 257/88 |
| 2010/0327258 A1 | 12/2010 | Lee et al. | | |
| 2011/0254034 A1 * | 10/2011 | Konsek | ................. | B82Y 20/00 257/98 |
| 2011/0309378 A1 | 12/2011 | Lau et al. | | |
| 2012/0068207 A1 * | 3/2012 | Hata | ................. | H01L 27/1446 257/94 |
| 2012/0086044 A1 | 4/2012 | Hata et al. | | |
| 2013/0027623 A1 * | 1/2013 | Negishi | ................. | H01L 25/0753 349/42 |
| 2013/0228793 A1 | 9/2013 | Kim et al. | | |

FOREIGN PATENT DOCUMENTS

| | | |
|---|---|---|
| CN | 101627482 A | 1/2010 |
| CN | 102057507 A | 5/2011 |
| CN | 102089893 A | 6/2011 |
| CN | 102403302 A | 4/2012 |
| DE | 102010012711 A1 | 9/2011 |
| JP | 2000022128 A | 1/2000 |
| JP | 2001339060 A | 12/2001 |
| JP | 2002100804 A | 4/2002 |
| JP | 2003078127 A | 3/2003 |
| JP | 2003345267 A | 12/2003 |
| JP | 2006196693 A | 7/2006 |
| JP | 2008124376 A | 5/2008 |
| JP | 2008-277409 A | 11/2008 |
| JP | 2009542560 A | 12/2009 |
| JP | 2010157692 A | 7/2010 |
| JP | 2011014896 A | 1/2011 |
| JP | 2011519162 A | 6/2011 |
| JP | 2011527519 A | 10/2011 |
| JP | 2013501357 A | 1/2013 |
| WO | 2008/048704 A2 | 4/2008 |
| WO | 2010/014032 A1 | 2/2010 |
| WO | WO-2011014490 A2 | 2/2011 |

OTHER PUBLICATIONS

Tomioka et al., "A III-V nanowire channel on silicon for high-performance vertical transistors", Nature 488 (2012) pp. 189-193.*
Hamedi-Hagh et al., "Applications of Nanowire Transistors for Driving Nanowire LEDs", Transactions on Electrical and Electronic Materials 13 (2012) pp. 73-77.*
"Bright future for gaN nanowires", Phys.org (2011).*
Fan, Z. et al.: "III-nitride micro-emitter arrays: development and applications", J. Phys. D: Appl. Phys. vol. 41, 2008, 094001,pp. 1-12.

* cited by examiner

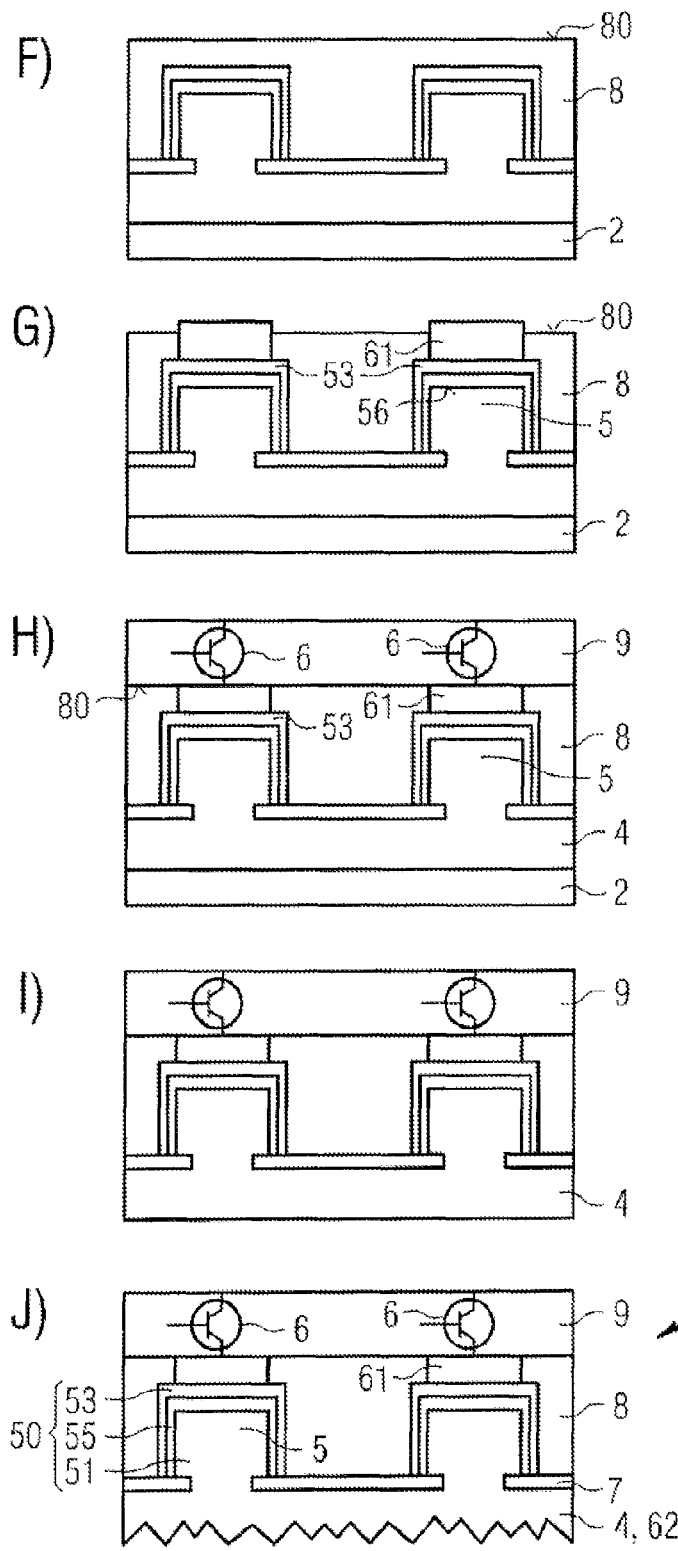

A)

B)

C)

D)

E)

F)

G)

H)

A)

B)

C)

D)

E)

METHOD FOR PRODUCING A LIGHT-EMITTING DIODE DISPLAY AND LIGHT-EMITTING DIODE DISPLAY

A method for producing a light-emitting diode display is specified. In addition, a light-emitting diode display is specified.

One object to be achieved is to specify a method, using which a micro-pixelated light-emitting diode display having a high quality is producible.

This object is achieved, inter alia, by a method and by a light-emitting diode display having the features of the independent patent claims. Preferred refinements are the subject matter of the dependent claims.

According to at least one embodiment, the method is provided for producing a light-emitting diode display. Light-emitting diode display can mean that radiation emitted in operation from the display is completely or predominantly generated by means of light-emitting diodes, LEDs in short. The light-emitting diode display can be an active matrix display. It is possible that the light-emitting diode display is free of a liquid crystal matrix.

According to at least one embodiment, the method comprises the step of providing a growth substrate. The growth substrate has a substrate top side. The growth substrate is, for example, a sapphire substrate or a silicon substrate.

According to at least one embodiment, the method comprises the step of applying one or more buffer layers indirectly or directly to the substrate top side. The at least one buffer layer can be in direct contact with the substrate top side or can be spaced apart from the substrate top side by one or more intermediate layers.

According to at least one embodiment, the method has the step of creating a plurality of separate growth points. The growth points are created at, in, and/or on the buffer layer. For example, the growth points are specific local regions of the buffer layer.

According to at least one embodiment, the method has the step of creating individual, radiation-active islands. The islands are created originating from the growth points, for example, by means of epitactic growth.

According to at least one embodiment, the islands each comprise an inorganic semiconductor layer sequence or consist of such a semiconductor layer sequence. The semiconductor layer sequence of the islands contains one or more active zones for generating radiation in operation of the light-emitting diode display. The active zone can be a single quantum well structure or a multiple quantum well structure or a pn-junction.

The semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$, wherein in each case $0 \leq n \leq 1$, $0 \leq m \leq 1$, and $n+m \leq 1$. In this case, the semiconductor layer sequence can have dopants and additional components. However, for the sake of simplicity, only the essential components of the crystal lattice of the semiconductor layer sequence, i.e., Al, As, Ga, In, N, or P, are specified, even if they can be partially replaced and/or supplemented by small amounts of further materials.

According to at least one embodiment, the islands, seen in a top view of the substrate top side, have a mean diameter of at least 50 nm or of at least 200 nm or of at least 500 nm or of at least 0.5 µm or of at least 10 µm. Alternatively or additionally, the mean diameter of the islands is at most 20 µm or at most 5 µm or at most 2 µm. It is possible that the islands have an aspect ratio, i.e., a quotient of a mean height and the mean diameter, of >1 or >2 or >5. The aspect ratio can be, for example, <25 or <20 or <15.

According to at least one embodiment, the method has the step of interconnecting the islands with transistors. The islands are electrically controllable individually or in groups via the transistors. In this case, precisely one island in each case or also multiple islands which are electrically connected in parallel can be electrically conductively connected to precisely one transistor. In other words, the light-emitting diode display is then a so-called micro-pixelated display, wherein the individual islands form the micro-pixels.

In at least one embodiment, the method is configured for producing a light-emitting diode display. The method comprises at least the following steps:

A) providing a growth substrate having a substrate top side,
B) applying at least one buffer layer indirectly or directly to the substrate top side,
C) creating a plurality of separate growth points on or at the buffer layer,
D) creating individual, radiation-active islands, originating from the growth points, wherein the islands each comprise an inorganic semiconductor layer sequence having at least one active zone and a mean diameter of the islands, seen in a top view of the substrate top side, is between 50 nm and 20 µm inclusive, and
E) interconnecting the islands with transistors for an electrical actuation of the islands.

The method steps are preferably executed in the specified sequence. A different sequence is also possible, if it can be technically carried out.

In the production of micro-pixelated displays based on light-emitting diodes, in the case of a conventional production approach, i.e., a segmentation of a flatly applied epitaxial layer, high demands arise with respect to a low-defect structuring. Such a production approach is also referred to as a top-down approach. If a display having an active matrix circuit is additionally to be formed, a carrier having the required transistor elements must also be applied aligned accurately with the illuminated areas, in particular formed by the micro-pixels.

A structuring of a semiconductor layer sequence toward a micro-pixelated display is performed, for example, by dry chemical methods. A carrier having the segmented semiconductor layer sequence and the micro-pixels is typically bonded in a flip chip method to a wafer having the driver circuits.

The described light-emitting diode display is based on the idea, inter alia, that epitactic structures, which are deposited in the micro-range or in the nano-range in a structured manner on a growth substrate, are used for the micro-display. Corresponding production is also referred to as the bottom-up approach. One epitactic growth island preferably precisely corresponds to one later light pixel in this case. However, it is also possible that smaller islands are combined to form one light pixel. In addition, with such a method, the possibility exists of carrying out the epitactic growth directly on the same substrate which is also provided previously or later with the driver transistors. In this way, a bonding operation between the carrier having the micro-pixels and the carrier having the driver circuit can be omitted. Furthermore, structuring of a semiconductor layer sequence with an active zone after the epitaxy can be omitted. Segmentation to form the micro-pixels is thus already predefined by the growth. In this way, in particular a high material quality and therefore a suppression of leakage currents induced by etching damage are achievable.

Due to the targeted, three-dimensional growth of the islands, damage of the active zone by structuring processes such as etching is avoidable. A risk of possible damage by way of electrostatic discharges, problems with small currents, and/or shunt circuits can hereby be minimized.

A loss of a radiation-active area by the structuring can be compensated for by a core-shell structure of the islands. With a high aspect ratio, an increase of active area in comparison to a planar top-down approach is even possible. Therefore, an efficiency increase is also possible by reducing the current density while simultaneously maintaining the light density.

In the case of an integration of a transistor control-logic in the growth substrate, a precise and accurately aligned bonding in a subsequent step is not necessary. A growth of comparatively thinner islands in the form of so-called nanorods additionally enables an improvement of the material quality, since dislocations turn off at nearby surfaces, instead of penetrating the entire, epitactically grown layer thickness.

Due to a growth of individually standing, three-dimensional islands in the form of nanostructures or microstructures instead of a closed two-dimensional layer, tensions which occur upon the use of materials having different lattice constants and/or coefficients of expansion can additionally be dissipated or reduced. This also reduces sagging of a wafer and/or the growth substrate during growth and can simplify processing, especially in the case of bonding on other materials or wafers. Furthermore, larger substrates or foreign substrates can be used for the growth.

According to at least one embodiment of the method, the transistors are created in the growth substrate. This is performed, for example, by doping specific subregions of the growth substrate. In particular, the transistors are created as field effect transistors, FET in short, or as pnp-transistors in the growth substrate.

According to at least one embodiment, the step of creating the transistors partially or completely follows step D). In particular with regard to thermal stresses, for example, by diffusions in p-wells and n-wells of the transistor, which act during the growth, alternatively, however, some or all process steps for the production of the transistors can be carried out prior to step D).

According to at least one embodiment of the method, in step E), a carrier substrate is applied to a side of the islands facing away from the growth substrate. The carrier substrate is then preferably the component which mechanically stabilizes and mechanically carries the light-emitting diode display. The carrier substrate is, for example, a silicon substrate.

According to at least one embodiment, the method comprises the step of removing the growth substrate. In particular, the growth substrate is removed after the carrier substrate is applied. If the growth substrate comprises the transistors, the growth substrate thus preferably remains on the finished produced light-emitting diode display.

According to at least one embodiment, the transistors for activating the islands are comprised by the carrier substrate. The transistors are preferably manufactured in the carrier substrate before the carrier substrate is fastened to the islands.

According to at least one embodiment of the method, the buffer layer is applied as a two-dimensional, unstructured layer. This means that the buffer layer is created in a constant thickness without targeted thickness variation or material variation.

According to at least one embodiment, a masking layer made of an electrically insulating material or of an electrically conductive material is applied to the buffer layer. The masking layer has a plurality of openings and is preferably deposited prior to step D). The islands grow on the buffer layer originating from the openings in the masking layer. A material of the masking layer is, for example, a silicon oxide or a silicon nitride.

According to at least one embodiment, the masking layer remains in the finished light-emitting diode display. This means the masking layer is not subsequently removed, for example, by etching. In particular, the masking layer is no longer or no longer significantly changed in its thickness or geometric shape after step D).

According to at least one embodiment of the method, the islands are grown so that they protrude over the masking layer. A height of the islands is then greater than a thickness of the masking layer in relation to the substrate top side. The height of the islands exceeds the thickness of the masking layer, for example, by at least a factor of 10 or by at least a factor of 100 or by at least a factor of 1000.

According to at least one embodiment, an intermediate layer is located between the buffer layer and the growth substrate. The intermediate layer is formed, for example, from a metal nitride such as aluminum nitride or hafnium nitride. In particular, gallium from the buffer layer can be prevented by the intermediate layer from coming into contact with a material of the growth substrate, in particular with silicon.

According to at least one embodiment, the growth islands are created by a structuring of the buffer layer. The structuring of the buffer layer is preferably performed by a material removal of material of the buffer layer.

According to at least one embodiment, the structuring of the buffer layer is carried out with the aid of a masking technology. For example, material of the buffer layer is partially or completely removed in regions which are not covered by a mask. It is possible in this case that the buffer layer remains as a continuous layer, so that, for example, a thickness of the buffer layer is reduced around the growth islands, but is greater than zero.

According to at least one embodiment, the structuring of the buffer layer is performed prior to the deposition of the masking layer for the growth islands. For example, an electrically insulating layer made of a silicon oxide is applied to the structured buffer layer outside the growth islands, wherein this layer can then form the masking layer and partially or completely covers the lateral surfaces of the growth islands, for example.

According to at least one embodiment, a first buffer layer, in particular made of an oxide or nitride of a transition metal or a rare earth metal, is applied directly to the growth substrate. For example, the first buffer layer consists of hafnium nitride. Furthermore, preferably prior to step C), a second buffer layer different therefrom is applied directly to the first buffer layer. The second buffer layer is preferably based on or consists of GaN or of AlGaN. The islands and the semiconductor layer sequence are then preferably based on AlInGaN.

According to at least one embodiment, in which the growth substrate preferably comprises the transistors, a Bragg mirror follows the first buffer layer, in particular directly. The Bragg mirror can be epitactically grown. The Bragg mirror is a multiple layer sequence, for example, made of a rare earth oxide, a rare earth nitride, a III-V compound, and/or a III-nitride compound.

According to at least one embodiment, a region between neighboring islands is completely or partially filled with a filling compound after step D). The filling compound can touch the islands or can be separated from the islands by an intermediate layer. The filling compound is preferably formed as a negative of the islands and is molded in a formfitting manner on the islands.

According to at least one embodiment, the filling compound is configured for an adjustment or a reduction of optical coupling between neighboring islands. For this purpose, the filling compound can be made, for example, radiation-opaque, radiation-reducing, radiation-absorbing, radiation-transmissive, or light-scattering. Optically active materials such as phosphors, scattering particles, or reflecting particles can also be embedded in the filling compound or in subregions of the filling compound.

According to at least one embodiment, the filling compound only partially fills up regions between the neighboring islands. In particular, the filling compound is then arranged like islands around the islands. It is possible that the filling compound is formed as one-piece or by a plurality of separate regions, wherein each of the separate regions is then preferably associated with precisely one of the islands. A further filling, which is embodied as reflective, for example, can be introduced into regions between neighboring filling compounds.

According to at least one embodiment, in step E), the transistors are created in the growth substrate on a side of the growth substrate facing away from the islands. This step can follow step D) or can at least partially precede step D).

According to at least one embodiment, the islands and the transistors overlap, seen in a top view of the growth substrate and/or the substrate top side. In this way, a particularly space-saving arrangement of the transistors and the islands in relation to one another is achievable.

According to at least one embodiment, the buffer layer is or the islands are exposed at points in step E), specifically from the side of the growth substrate facing away from the islands. A through-contact to the islands and/or to the buffer layer can be produced through the growth substrate. The exposed points of the buffer layer and/or the islands are preferably provided with one or more metallizations.

According to at least one embodiment, the buffer layer is provided with a structuring on a side facing away from the carrier substrate. This is preferably performed after step E). The structuring of the buffer layer can be provided for optical decoupling between neighboring islands. For example, the structuring is formed as deeper at points or is only applied to specific regions, for example, congruently over the islands. Alternatively or additionally to the buffer layer, the n-conductive layer of the islands can also be provided with the structuring.

In addition, a light-emitting diode display is specified. The light-emitting diode display is produced in particular using a method as described in conjunction with one or more of the above-mentioned embodiments. Features of the method are therefore also disclosed for the light-emitting diode display and vice versa.

In at least one embodiment, the light-emitting diode display contains a carrier having a plurality of transistors and a plurality of individual, radiation-active islands. The islands each have an inorganic semiconductor layer sequence having one or more active zones. A mean diameter of the islands, seen in a top view of the carrier, is between 50 nm and 20 µm inclusive. The islands are electrically interconnected with the transistors.

According to at least one embodiment, a mean height of the semiconductor layer sequence of the islands and/or a mean height of the islands, in relation to the buffer layer or on a side of the carrier facing toward the islands, is at least 0.2 µm or at least 2 µm. Alternatively or additionally, this mean height is at most 25 µm or at most 6 µm.

According to at least one embodiment of the light-emitting diode display, precisely one of the islands is associated with each of the transistors. It is possible that a number of the islands is equal or approximately equal to the number of the transistors.

According to at least one embodiment, pixels of the light-emitting diode display are formed from the islands. For example, one pixel is formed by precisely one of the islands. Alternatively thereto, it is possible that multiple islands form a pixel. The multiple islands are then preferably configured for emitting light in various spectral ranges, for example, for emitting red light, green light, and blue light.

A method described herein and a light-emitting diode display described herein are explained in greater detail hereafter with reference to the drawing on the basis of exemplary embodiments. Identical reference signs indicate identical elements in the individual figures in this case. However, references to scale are not shown in this case, rather, individual elements can be largely exaggerated for better comprehension.

Figure 2:
Figure 2:
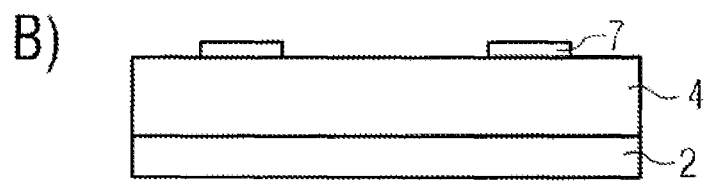
Figure 2:
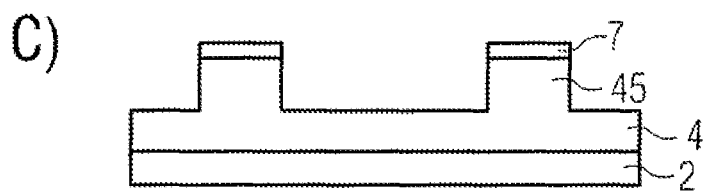
Figure 2:
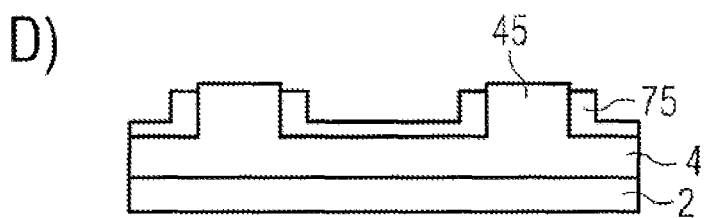
Figure 2:
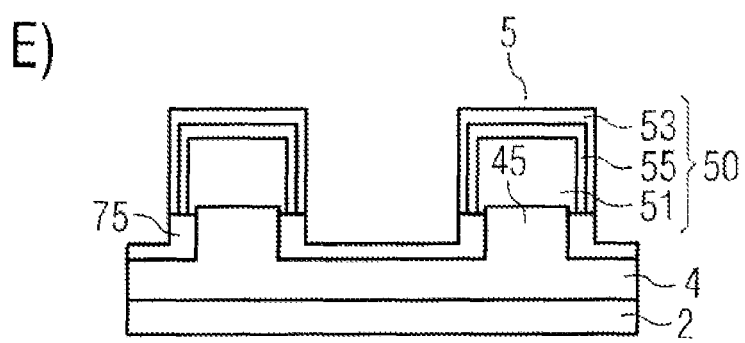
Figure 3:
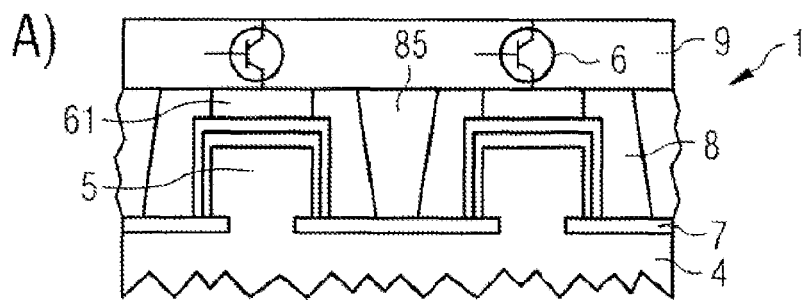
Figure 3:
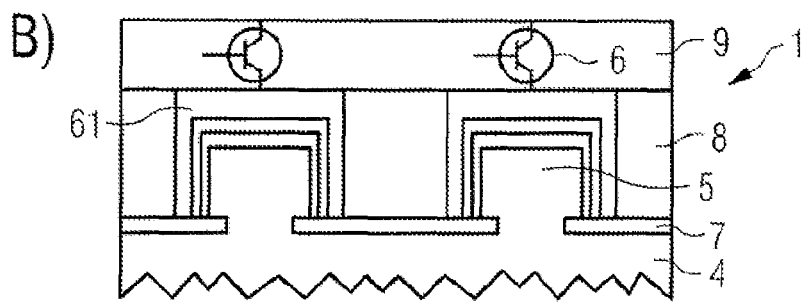
Figure 3:
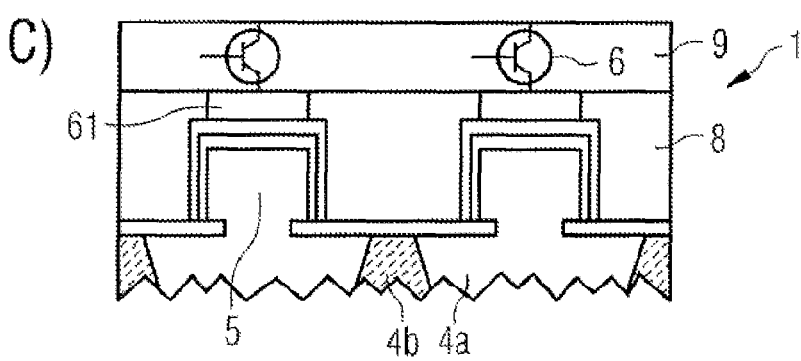
Figure 3:
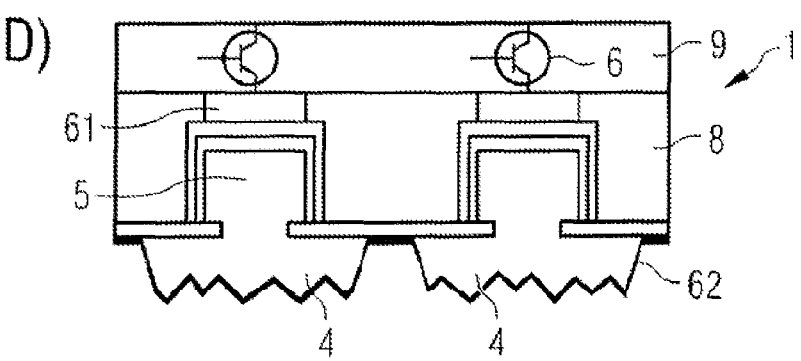
Figure 4:
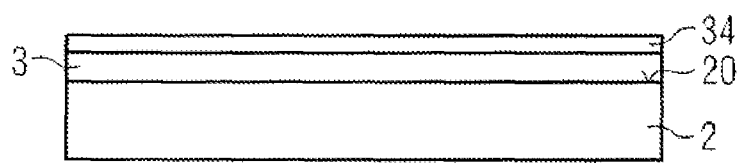
Figure 4:
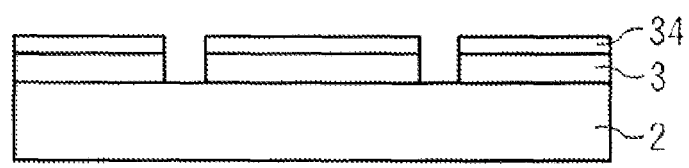
Figure 4:
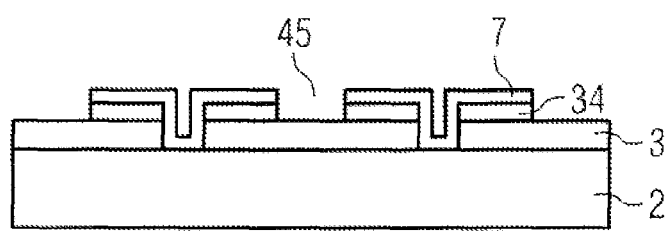
Figure 4:
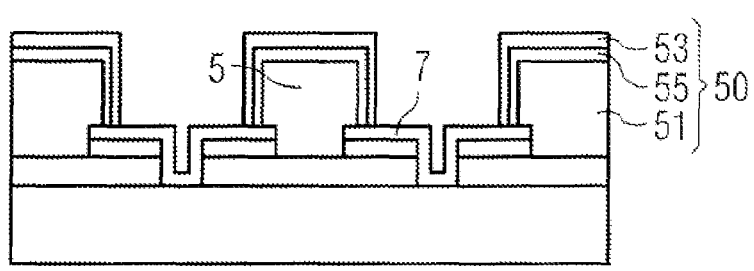
Figure 4:
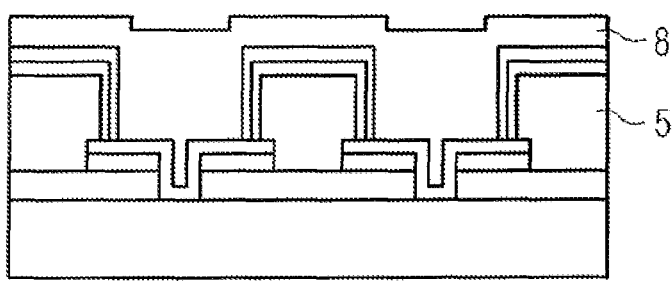
Figure 4:
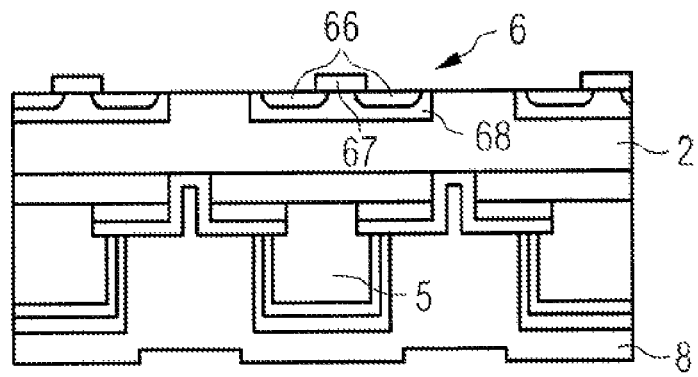
Figure 4:
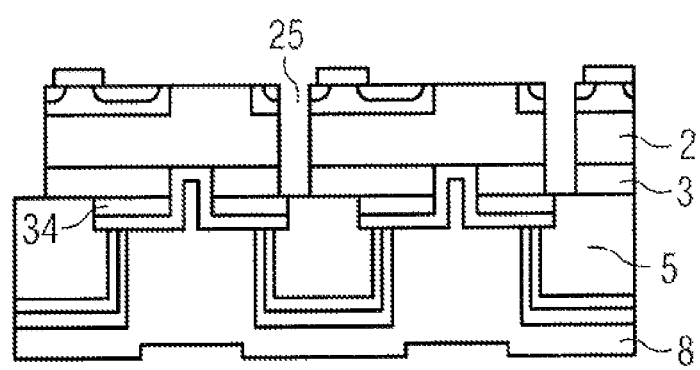
Figure 4:
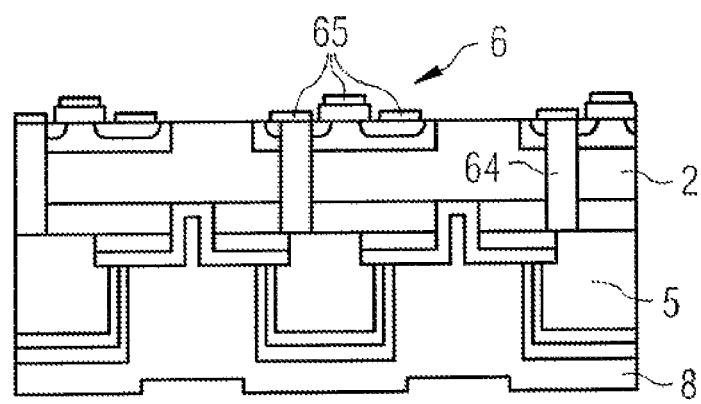
Figure 4:
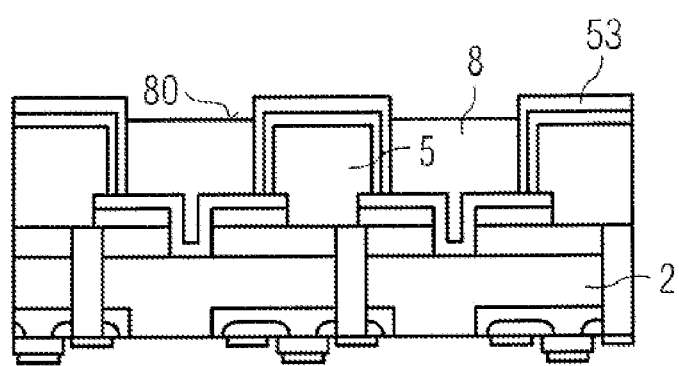
Figure 4:
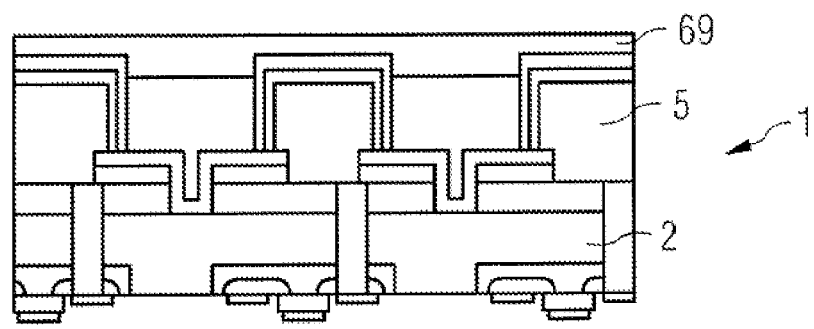

In the figures:

FIGS. 1, 2, 4, and 5 show schematic sectional illustrations of exemplary embodiments of methods described here for producing light-emitting diode displays described here, and FIG. 3 shows schematic sectional illustrations of exemplary embodiments of light-emitting diode displays described here.

A method for producing a light-emitting diode display 1 is illustrated in FIG. 1 in sectional illustrations. According to FIG. 1A, a growth substrate 2 having a substrate top side 20 is provided, for example, a sapphire substrate. A buffer layer 4, in particular made of n-doped GaN is applied to the sapphire substrate. A thickness of the buffer layer 4 is, for example, at least 200 nm and/or at most 6 µm. A masking layer 7 is located on a side of the continuous, two-dimensional buffer layer 4 facing away from the substrate top side 20. A plurality of openings is formed in the masking layer 7. The masking layer 7 is formed, for example, from silicon dioxide, silicon nitride, titanium, or molybdenum. The openings in the masking layer 7, in which the buffer layer 4 is exposed, represent growth points 45.

FIG. 1B shows that, originating from the growth points 45, an n-conductive layer 51 is grown on the buffer layer 4. The n-conductive layer 51 is in the form of columns, prisms, or truncated pyramids, for example, and can have a round or a polygonal, in particular a hexagonal or square outline seen in a top view of the substrate top side 20. It is possible that a mean diameter of the n-conductive layer 51 exceeds a mean thickness of the n-conductive layer 51 or vice versa. The n-conductive layer 51 is preferably formed from n-doped GaN. The n-conductive layer 51 protrudes beyond the masking layer 7 in the direction away from the growth substrate 2.

As can be seen in FIG. 1C, an active zone 55 is grown on lateral surfaces 58 and on a top side 56, which faces away from the growth substrate 2, of the n-conductive layer 51. A p-conductive layer 53 is in turn grown on the active zone 55, see FIG. 1D. The p-conductive layer 53, preferably based on p-doped GaN, and the active zone 55 represent a shell for the n-conductive layer 51, which forms a core.

The layers 51, 53 and the active zone 55 are part of a semiconductor layer sequence 50. The semiconductor layer sequence 50 forms an island 5 in each case, which is radiation-active because of the active zone 55. Neighboring islands 5 are connected to one another via the buffer layer 4 in the method step according to FIG. 1D.

FIG. 1E shows that the islands 5 are covered by a filling compound 8. The filling compound 8 is an electrically insulating material. The filling compound 8 can be embodied as radiation-transmissive or radiation-opaque and/or can consist of a combination of various layers of radiation-transmissive, radiation-opaque, or radiation-scattering materials. The filling compound 8 completely fills up regions between neighboring islands 5 and the filling compound 8 is in direct contact with the islands 5 and encloses the islands 5 in a formfitting manner.

The filling compound 8 is subsequently planarized and a top side 80 of the filling compound 8 is formed on a side opposite to the growth substrate 2, cf. FIG. 1F. For example, the filling compound 8 consists of or comprises one or more of the materials mentioned hereafter: a silicon oxide, silicon nitride, a silicon oxynitride, $AlO_x$, AlN, TaO, TiO, silicon, benzocyclobutene, hydrogen silsesquioxane, parylene, spin-on-glass, silicone, or a polymer.

As shown in FIG. 1G, the filling compound 8 is partially removed on the top sides 56 of the islands 5 and a p-contacting 61 is formed on the p-conductive layer 53. The p-contacting 61 is preferably one or more metallizations. Furthermore, the p-contacting 61 is preferably embodied as reflective and can contain a silver layer or an aluminum layer for this purpose. Furthermore, the p-contacting 61 can be formed as a solder contact point. In contrast to the illustration, it is possible that the p-contacting 61 terminates flush with the top side 80 of the filling compound 8, or that the filling compound 8 protrudes beyond the p-contacting 61.

It is illustrated in FIG. 1H that a carrier substrate 9 is applied to the top side 80. The carrier substrate 9 comprises a plurality of transistors 6, which are schematically shown. Each of the transistors 6 is associated with one of the islands 5 and is electrically conductively connected to the p-contacting 61. The schematically illustrated transistor 6 can be composed of an interconnection of multiple transistors 6, which are suitable in particular for supplying the p-contacting 61 and therefore the island 5 with current on an electrical voltage signal. The carrier substrate 9 can be mechanically, electrically, and/or thermally connected to the p-contacting 61 by soldering, gluing, friction welding or direct bonding.

The carrier substrate 9 is preferably a silicon substrate, into which the transistors 6 are monolithically integrated. In contrast to the illustration, it is possible that an intermediate layer is located between the filling 8 and the carrier substrate 9 at least in regions which are free of the p-contacting 61. Such an intermediate layer can be embodied as a mirror.

According to FIG. 1I, the growth substrate 2 is removed and the buffer layer 4 is exposed on a side opposite to the carrier substrate 9.

The finished light-emitting diode display 1 is visible in FIG. 1J. Further components of the light-emitting diode display such as connection points to the external electrical contacting, protective layers, signal lines, components for signal processing such as shift registers, protective devices against damage from electrostatic discharges, an encapsulation, or a housing are not shown in each case for simplification of the illustration. There is no continuous connection made of comparatively strongly electrically-conductive layers between neighboring islands 5, so that no or no significant leakage currents or cross currents occur between neighboring islands 5.

The buffer layer 4 is optionally provided with a structuring. The structuring is, for example, a roughening, which can be created by means of KOH etching. It is possible that an n-contacting 62 of the islands 5 is formed via the buffer layer 4. Alternatively thereto, it is possible that a further, electrically conductive and preferably radiation-transmissive layer (not shown) is applied to the buffer layer 4.

Furthermore, it is optionally possible, as also in all other exemplary embodiments, that a wavelength conversion means (not shown) is associated with the islands 5 or a part of the islands 5, which can be located in the filling compound 8 or on a side of the buffer layer 4 facing away from the carrier 9. Via such a wavelength conversion means, it is possible to partially or completely convert primary radiation generated in the active zone 55 into radiation of a wavelength different therefrom. Alternatively to a wavelength conversion means, the active zones 55 of various islands 5 can also be configured to emit different wavelengths.

Furthermore, a liquid crystal mask, for example, for color filtering, can optionally be arranged downstream from the islands 5, in particular on a side of the buffer layer 4 facing away from the carrier substrate 9.

A further exemplary embodiment of the production method is illustrated in FIG. 2. According to FIG. 2A, the buffer layer 4 is grown on the growth substrate 2, for example, a sapphire substrate. If the growth substrate 2 is a silicon substrate, for example, a further layer, in particular made of AlN, is thus preferably located between the buffer layer 4 made of n-doped GaN and the growth substrate 2.

As is visible in FIG. 2B, a masking layer 7, for example, made of a photoresist, is applied on a side of the buffer layer 4 facing away from the growth substrate 2. The regions of the buffer layer 4 covered by the masking layer 7 are preferably formed like islands and can be formed as round or polygonal, seen in a top view.

According to FIG. 2C, the buffer layer 4 is structured by partial material removal, for example, by dry chemical etching. The growth points 45 result therefrom in regions covered by the masking layer 7.

Subsequently, cf. FIG. 2D, the masking layer 7 is removed and the growth points 45 are exposed. Optionally, a passivation layer 75 is applied to the buffer layer 4 and to crust surfaces of the growth points 45. The passivation layer 75 is formed of silicon oxide or silicon nitride, for example, and can have a thickness between 10 nm and 200 nm inclusive.

It is illustrated in FIG. 2E that the semiconductor layer sequence 50 is applied to the growth points 45 and therefore to the regions of the buffer layer 4 which are not covered by the passivation layer 75. The semiconductor layer sequence 50, which forms the islands 5, can be constructed as explained in conjunction with FIG. 1.

The further method steps (not shown in FIG. 2), can be performed similarly to FIGS. 1E to 1J.

FIG. 3 shows further exemplary embodiments of the light-emitting diode display 1 in sectional illustrations. The light-emitting diode displays according to FIG. 3 differ in particular in the embodiment of the filling compound 8 and the buffer layer 4. Corresponding exemplary embodiments of the light-emitting diode display 1 are producible similarly to the production methods according to FIGS. 1 and 2.

According to FIG. 3A, the filling compound 8 is divided into a plurality of island-like or shell-like regions, wherein each of these island-like regions presses against one of the islands 5 and is not connected to further island-like regions by a material of the filling compound 8. In contrast to the illustration, a thin, continuous layer of the filling compound 8 can be provided close to the masking layer 7.

Regions between neighboring sections of the filling compound 8 can be provided with a reflective filling 85. Neighboring islands 5 can be optically isolated from one another via such a reflective filling 85. The reflective filling 85 can be a metallic filling. In contrast to the illustration, the reflective filling 85 can be restricted to lateral surfaces of the individual regions of the filling compound 8 and then can only incompletely fill up an intermediate space between neighboring filling compounds 8.

The masking layer 7 can also be removed in the region of the metallic, reflective filling 85, in contrast to the illustration, so that the reflective filling 85 has electrical contact to the buffer layer 4 and therefore an electrical cross conductivity is improved. In this case, seen in a top view, the reflective filling 85 can extend as a coherent network over the carrier 9, wherein the islands 5 are located in meshes of this network.

According to FIG. 3B, the p-contacting 61 extends like a cylindrical crust around the islands 5, in a half space facing toward the carrier substrate 9, in relation to the masking layer 7. The p-contacting 61 is preferably formed using a reflective metal.

Corresponding embodiments of the filling compound 8 and of the p-contacting 61, as shown in conjunction with FIGS. 3A and 3B, can also be present in FIGS. 3C and 3D, in contrast to the illustration.

It is illustrated in FIG. 3C that the buffer layer is structured. First regions 4a of the buffer layer are arranged directly downstream from the islands 5 along a main emission direction and are provided with a structuring to improve the light decoupling. Regions 4b between neighboring islands 5 are partially separated from one another. This is achievable, for example, by way of a modified structuring in the regions 4b or by way of a partial coating in these regions 4b.

According to FIG. 3D, the individual regions of the buffer layer 4, which are arranged downstream from the islands 5, are completely separated from one another. Furthermore, these regions are provided with an electrically conductive layer 62, for example, made of a transparent conductive oxide such as indium-tin oxide. An n-contacting is implementable via the layer 62. A corresponding conductive layer can also be provided in all other exemplary embodiments.

In the methods according to FIGS. 1 and 2, the carrier substrate 9 having the transistors 6 was subsequently bonded to the islands 5. In the methods according to FIGS. 4 and 5, the transistors 6 are integrated into the growth substrate 2.

According to FIG. 4A, the buffer layer 3, for example, made of HfN, is deposited on the growth substrate 2, preferably a silicon substrate. An etch stop layer 34 is optionally subsequently applied to this buffer layer 3.

It can be seen in FIG. 4B that the buffer layer 3 and the etch stop layer 34 are structured. The buffer layer 3 is completely removed from the growth substrate 2 at points. If the buffer layer 3 is an electrically insulating layer, the structuring of the buffer layer 3 can optionally be omitted.

According to FIG. 4C, the masking layer 7 is regionally applied to the etch stop layer 34. The masking layer 7 is in direct contact at points with the growth substrate 2 in this case. The etch stop layer 34 lies between the buffer layer 3 and the masking layer 7 at points. Regions of the buffer layer 7 which are not covered by the optional etch stop layer 34 and by the masking layer 7 form the growth points 45.

Originating from the growth points 45, the semiconductor layer sequence 50, which forms the islands 5, is grown, as shown in FIG. 4D.

Subsequently, cf. FIG. 4E, the filling compound 8 is applied between the islands 5. The filling compound 8 preferably completely covers the islands 5 in this case, so that the islands 5 are embedded in the filling compound 8 in a formfitting manner.

On a side of the growth substrate 2 facing away from the islands 5, the transistors 6, which are so-called pnp-transistors, for example, are created according to FIG. 4F. For this purpose, a larger well 68 is formed from a doped region in the growth substrate 2. Two opposing doped, smaller regions 66, between which the gate 67 is located, are formed in this larger well 68. The smaller regions 66 are provided for source and drain.

In contrast to the illustration in FIG. 4F, an auxiliary carrier (not shown) can be located on a side of the filling compound 8 facing away from the growth substrate 2. Notwithstanding the illustrated sequence of the method steps, at least parts of the regions 66, 67, 68 can already be created prior to the method steps of FIGS. 4A to 4E.

In the method step shown in FIG. 4G, openings 25 for through-contacts are formed in the growth substrate 2. The through-contacts, which are created via dry etching, for example, extend up to the islands 5 and can completely penetrate the buffer layer 3. In particular, the openings 25 extend up to the etch stop layer 34. Adjustment of the openings 25 is performed, for example, by means of the Bosch process and optionally following etching of possibly nonconductive growth layers.

It is illustrated in FIG. 4H that metallizations 65 are applied to the through-contacts 64 created in the openings 25 and to the doped regions 66 and the gate 67 of the transistor 6. The transistors 6 can be electrically contacted through them.

In an optional method step (not shown), wiring levels and protective layers can subsequently be formed on a side of the growth substrate 2 facing away from the islands 5.

According to FIG. 4I, the filling compound 8 is partially removed, so that the p-conductive layer 53 of the islands 5 is exposed. In contrast to the illustration, the remaining filling compound 8 can terminate flush with the p-conductive layer 53 in the direction away from the growth substrate 2, so that a planar, flat top side 80 is formed.

The finished light-emitting diode display 1 is illustrated in FIG. 4J. An electrode 69 is attached to the islands 5 on a side facing away from the growth substrate 2. The electrode 69 is preferably radiation-transmissive and is formed, for example, from indium-tin oxide. The electrode 69, as in all other exemplary embodiments, can be a continuous layer and an individualized actuation of the islands 5 is enabled via a wiring level for the transistors 6 on a side of the growth substrate 2 or the carrier substrate 9 facing away from the islands 5. The filling compound 8 and a side of the electrode 69 facing away from the growth substrate 2 can be embodied as described in conjunction with FIG. 3.

Figure 5:
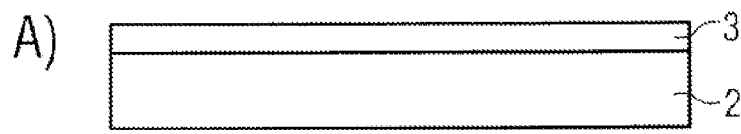
Figure 5:
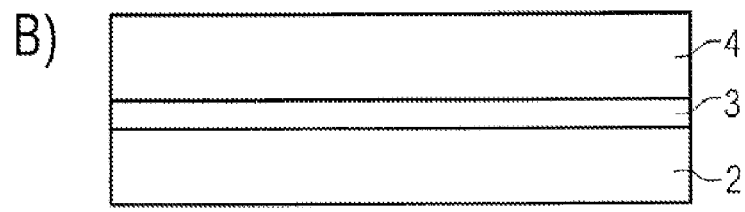
Figure 5:
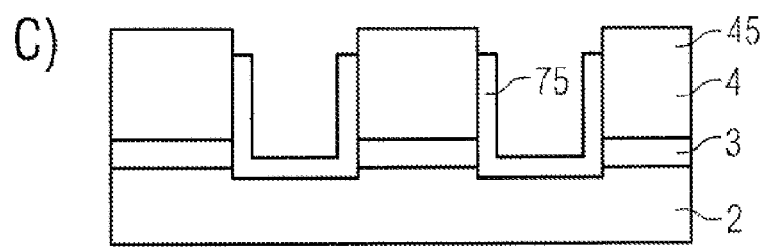
Figure 5:
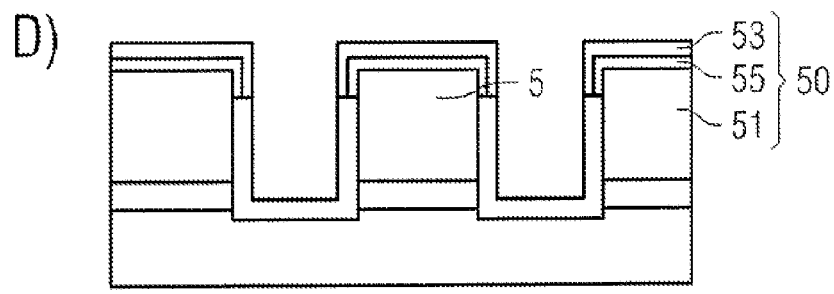
Figure 5:
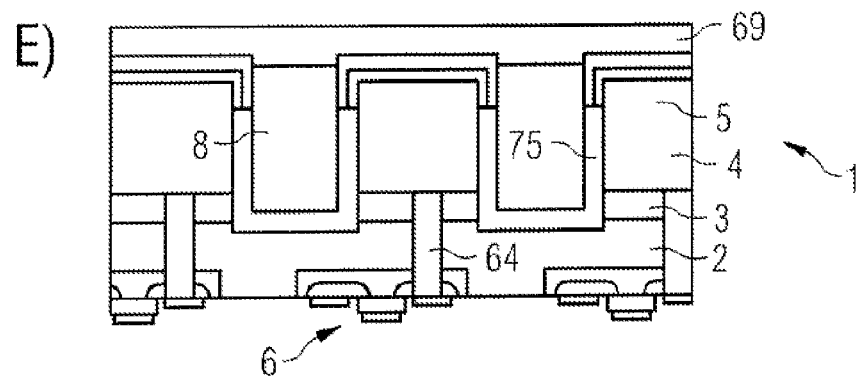

A further production method of the light-emitting diode display 1 is shown in FIG. 5, in which the transistors 6 are integrated into the growth substrate 2. It is illustrated in FIG. 5A that a first buffer layer 3, for example, made of HfN, is formed on the growth substrate 2.

A second buffer layer 4, for example, made of n-doped GaN, is applied to the first buffer layer 3, see FIG. 5B. The buffer layers 3, 4 can each be formed from a single layer or from layer stacks, as also in all other exemplary embodiments.

The buffer layers 3, 4 are partially or completely removed at points, so that the growth substrate 2 is exposed at points, see FIG. 5C. The remaining regions of the buffer layers 3, 4 then represent the growth points 45. Optionally, a passivation layer 75 can be applied to the exposed points of the growth substrate 2 and at least regionally or completely to crust surfaces of the buffer layers 4, wherein the growth points 45 remain free or are subsequently cleared again of the passivation layer 75.

According to FIG. 5D, the semiconductor layer sequence 50 and therefore the islands 5 are created, similarly to FIG. 2E. The further method steps can be performed based on FIGS. 4E to 4I.

The resulting light-emitting diode display 1 is shown in FIG. 5E. In contrast to the illustration in FIG. 4J, the through-contacts 64 extend into the second buffer layer 4 of the islands 5 and completely penetrate the first buffer layer 3. In this way, a greater bandwidth of materials can be used for the first buffer layer 3. Also contrary to FIG. 4J, the passivation layer 75 is formed as U-shaped viewed in cross section.

The invention described here is not restricted by the description on the basis of the exemplary embodiments. Rather, the invention comprises every novel feature and every combination of features, which includes in particular every combination of features in the patent claims, even if this feature or this combination is not itself explicitly specified in the patent claims or exemplary embodiments.

This patent application claims the priority of German patent application 10 2012 109 460.8, the content of the disclosure of which is hereby incorporated by reference.

The invention claimed is:

1. A light-emitting diode display comprising:
a carrier having a plurality of transistors; and
a plurality of individual, radiation-active islands,
wherein
each of the islands comprises an inorganic semiconductor layer sequence having at least one active zone,
a mean diameter of the islands, seen in a top view of the carrier, is between 50 nm and 20 µm inclusive,
a mean height of the inorganic semiconductor layer sequence of the islands is at least 1.5 µm,
the islands have a quotient of the mean height and the mean diameter being greater than 1 and smaller than 25,
the islands are electrically interconnected with the transistors,
the islands having the at least one active zone, an n-conductive layer and a p-conductive layer have a core-shell structure,
the p-conductive layer and the at least one active zone of the inorganic semiconductor layer sequence represent a shell for the n-conductive layer forming a core,
the carrier is a growth substrate on which the islands are grown,
the transistors are created in the growth substrate on a side of the growth substrate facing away from the islands, and
the transistors and the respective associated islands overlap, seen in a top view of the growth substrate.

2. The light-emitting diode display according to claim 1, wherein the islands are grown epitaxially on the growth substrate, and wherein the transistors are formed in the growth substrate.

3. The light-emitting diode display according to claim 1, wherein
the growth substrate is made of silicon,
a first buffer layer having an oxide or nitride of a transition metal or a rare earth metal is arranged directly on the growth substrate,
a second buffer layer comprising GaN or AlGaN is arranged directly on the first buffer layer, and
the inorganic semiconductor layer sequence comprises AlInGaN and the islands are grown on the second buffer layer.

4. The light-emitting diode display according to claim 1, wherein a region between neighboring islands is completely or partially filled with a filling compound.

5. The light-emitting diode display according to claim 4, wherein the filling compound only partially fills up the region between the neighboring islands and is arranged like a shell around the islands.

6. The light-emitting diode display according to claim 4, wherein at least one optically active material comprising scattering particles or a phosphor is added to the filling compound.

7. A light-emitting diode display comprising:
a carrier having a plurality of transistors; and
a plurality of individual, radiation-active islands,
wherein
each of the islands comprises an inorganic semiconductor layer sequence having at least one active zone,
a mean diameter of the islands, seen in a top view of the carrier, is between 50 nm and 20 µm inclusive,
a mean height of the inorganic semiconductor layer sequence of the islands is at least 1.5 µm,
the carrier is a growth substrate on which the islands are grown epitaxially,
the transistors are formed in the growth substrate,
the growth substrate has openings extending up to the radiation-active islands for forming through-contacts,
the through-contacts are configured for electrically contacting the radiation-active islands with the transistors, so that the radiation-active islands are electrically interconnected with the transistors formed in the growth substrate.

8. The light-emitting diode display according to claim 7, wherein
regions between neighboring radiation-active islands are filled with an electrically insulating material, so that the electrically insulating material is in direct contact with the islands and encloses the islands in a formfitting manner,
each of the transistors is associated with precisely one of the islands, and
pixels of the light-emitting diode display are formed by the islands.

9. The light-emitting diode display according to claim 7, wherein in a top view of the growth substrate, the transistors created in the growth substrate and the respective associated islands epitaxially grown on the growth substrate overlap each other.

10. The light-emitting diode display according to claim 7, wherein
the growth substrate comprises a well which is a doped region in the growth substrate,
two opposing doped regions are formed in the well,
a gate of one of the transistors is located between the two opposing doped regions, and the two opposing doped regions are provided for source and drain regions of the one of the transistors.

\* \* \* \* \*